(12) United States Patent
Tanaka et al.

(10) Patent No.: US 9,036,830 B2
(45) Date of Patent: May 19, 2015

(54) NOISE GATE, SOUND COLLECTION DEVICE, AND NOISE REMOVING METHOD

(75) Inventors: Ryo Tanaka, Hamamatsu (JP); Naoto Kuriyama, Hamamatsu (JP)

(73) Assignee: YAMAHA CORPORATION (JP)

( * ) Notice: Subject to any disclaimer, the term of this patent is extended or adjusted under 35 U.S.C. 154(b) by 870 days.

(21) Appl. No.: 13/130,532

(22) PCT Filed: Nov. 18, 2009

(86) PCT No.: PCT/JP2009/069588
§ 371 (c)(1),
(2), (4) Date: Jul. 19, 2011

(87) PCT Pub. No.: WO2010/058804
PCT Pub. Date: May 27, 2010

(65) Prior Publication Data
US 2011/0268288 A1    Nov. 3, 2011

(30) Foreign Application Priority Data

Nov. 21, 2008  (JP) ................................. 2008-298332

(51) Int. Cl.
*H04B 15/00*   (2006.01)
*G10L 21/0208* (2013.01)
(Continued)

(52) U.S. Cl.
CPC ......... *G10L 21/0208* (2013.01); *G10L 21/0232* (2013.01); *G10L 25/27* (2013.01); *H03G 3/345* (2013.01)

(58) Field of Classification Search
CPC . G10L 21/0208; G10L 21/0232; G10L 25/27; H03G 3/345
USPC .............................. 381/94.3, 94.1, 94.5, 94.7
See application file for complete search history.

(56) References Cited

U.S. PATENT DOCUMENTS

| 4,811,404 A | 3/1989 | Vilmur et al. |
| 5,839,101 A | 11/1998 | Vahatalo et al. |

(Continued)

FOREIGN PATENT DOCUMENTS

| JP | 9-204196 A | 8/1997 |
| JP | 2002-517021 A | 6/2002 |

(Continued)

OTHER PUBLICATIONS

Extended European Search Report issued Jul. 20, 2012 for corresponding EP Patent Application No. 09827585.2.

(Continued)

*Primary Examiner* — Joseph Saunders, Jr.
(74) *Attorney, Agent, or Firm* — Rossi, Kimms & McDowell LLP

(57) ABSTRACT

A purpose of the invention is to provide a noise gate that can output an audio signal in which only a stationary noise is removed, without degrading an utterance voice of a speaking person. A sound collection device 1 includes an FFT processing unit 11, the noise gate 12, and an IFFT processing unit 13. The sound collection device 1 transforms a collected audio signal NET into a frequency spectrum NE'N by using the FFT processing unit 11. The noise gate 12 estimates a noise spectrum N'N of a stationary noise based on the frequency spectrum NE'N of the audio signal. The noise gate 12 decreases a signal level (a gain) of the audio signal in a case where a signal level ratio of the frequency spectrum NE'N of the audio signal to the noise spectrum N'N is less than a threshold value, and outputs the audio signal. The sound collection device 1 outputs an audio signal CO'T which is generated in such a manner that the IFFT processing unit 13 inversely transforms a frequency spectrum CO'N after removing the stationary noise N'N.

6 Claims, 3 Drawing Sheets

(51) Int. Cl.
*H03G 3/34* (2006.01)
*G10L 21/0232* (2013.01)
*G10L 25/27* (2013.01)

(56) References Cited

U.S. PATENT DOCUMENTS

| | | |
|---|---|---|
| 5,963,901 A | 10/1999 | Vahatalo et al. |
| 6,175,602 B1 | 1/2001 | Gustafsson et al. |
| 6,459,914 B1 | 10/2002 | Gustafsson et al. |
| 6,574,593 B1 | 6/2003 | Gao et al. |
| 6,581,032 B1 | 6/2003 | Gao et al. |
| 6,604,070 B1 | 8/2003 | Gao et al. |
| 6,717,991 B1 | 4/2004 | Nordholm et al. |
| 6,757,649 B1 | 6/2004 | Gao et al. |
| 6,782,360 B1 | 8/2004 | Gao et al. |
| 6,959,274 B1 | 10/2005 | Gao et al. |
| 2001/0016020 A1 | 8/2001 | Gustafsson et al. |
| 2003/0200092 A1 | 10/2003 | Gao et al. |
| 2008/0269926 A1* | 10/2008 | Xiang et al. ............ 700/94 |
| 2009/0043574 A1 | 2/2009 | Gao et al. |

FOREIGN PATENT DOCUMENTS

| | | |
|---|---|---|
| JP | 2006-050067 A | 2/2006 |
| KR | 2002-0005674 A | 1/2002 |
| KR | 2002-0033819 A | 5/2002 |
| WO | 87/00366 A1 | 1/1987 |
| WO | 00/62579 A1 | 10/2000 |
| WO | 01/22402 A1 | 3/2001 |

OTHER PUBLICATIONS

Korean Office Action dated Jun. 21, 2012 issued in Korean counterpart application No. 10-2011-7011535. English translation provided.
International Search Report issued in PCT/JP2009/069588 dated Jan. 26, 2010.

* cited by examiner

US 9,036,830 B2

NOISE GATE, SOUND COLLECTION DEVICE, AND NOISE REMOVING METHOD

This application is a U. S. National Phase Application of PCT International Application PCT/JP2009/069588 filed on Nov. 18, 2009 which is based on and claims priority from JP 2008-298332 filed on Nov. 21, 2008 the contents of which is incorporated herein in its entirety by reference.

TECHNICAL FIELD

The present invention relates to a noise gate for removing a noise included in an audio signal, a sound collection device and a noise removing method.

BACKGROUND ART

A sound collection device of the related art is provided with a noise gate as a unit for removing a noise (e.g., patent document 1).

For example, the patent document 1 discloses a noise gate device that changes a threshold value of a noise gate in accordance with an amplification degree of a head amplifier for amplifying an audio signal and removes an audio signal less than the threshold value.

PRIOR ART DOCUMENTS

Patent Documents

Patent Document 1: JP-A-2006-50067

SUMMARY OF INVENTION

Problems that the Invention is to Solve

However, the noise gate device described in the patent document 1, removes an audio signal less than a threshold value. Therefore, the problem arises that in a case where an utterance voice of a speaking person is included in the audio signal less than the threshold value, the noise gate device removes the utterance voice having a signal level less than the threshold value.

In view of the above problem, a purpose of the invention is to provide a noise gate, a sound collection device and a noise removing method each capable of readily removing a stationary noise without degrading an audio signal.

Means for solving the Problems

A noise gate according to the invention estimates a noise spectrum of a stationary noise included in an input audio signal (hereinafter, referred to as the stationary noise) based on a frequency spectrum of the input audio signal. The noise gate computes a signal level ratio of the frequency spectrum of the input audio signal to the estimated noise spectrum. The noise gate outputs the frequency spectrum of the audio signal in which the signal level in a frequency band is decreased, the frequency band having the computed signal level ratio which is less than a predetermined threshold value.

With this configuration, the noise gate outputs a frequency spectrum of an audio signal including an utterance voice of a speaking person and suppresses a signal level in a frequency spectrum of an audio signal formed of a stationary noise so that the audio signal in which only the stationary noise is removed can be output without degrading the utterance voice of the speaking person.

Further, the threshold value can be set to a value greater than 1 which is a value compared to the signal level ratio by a value corresponding to an estimation error of an estimation unit. Since the noise gate computes the signal level ratio to be compared to the threshold value by using the estimated stationary noise, the estimation error of the stationary noise is considered.

With the above configuration, the noise gate can remove the stationary noise even in a case where the signal level of the stationary noise is estimated to be a value less than an actual value.

Moreover, a sound collection device according to the invention has the above described noise gate. The sound collection device transforms an audio signal generated by collecting a sound into a frequency spectrum as a signal of a frequency domain and outputs it to the noise gate. In addition, the sound collection device inversely transforms a frequency spectrum of an audio signal output from the noise gate into an audio signal as a signal of a time domain.

With the above configuration, the sound collection device can remove a stationary noise from the collected audio signal by using the above described noise gate. Therefore, the sound collection device can output a sound without degrading a collected utterance voice of a speaking person.

A noise removing method according to the invention includes a process of inputting a frequency spectrum of an audio signal, a process of estimating a noise spectrum based on the frequency spectrum of the audio signal input in the inputting process, a process of computing a signal level ratio of the frequency spectrum of the audio signal to the noise spectrum estimated in the estimating process, and a process of outputting the frequency spectrum of the audio signal in which the gain in a frequency band having the signal level ratio less than a predetermined threshold value is decreased, the signal level ratio being computed in the computing process.

In addition, the threshold value can be set to a value greater than 1 which is a value compared to the signal level ratio by a value corresponding to an estimation error of an estimation unit used in the estimating process.

Advantage of the Invention

The noise gate according to the invention can output an audio signal in which only a stationary noise is removed without degrading an utterance voice of a speaking person.

MODE FOR CARRYING OUT THE INVENTION

Figure 1:
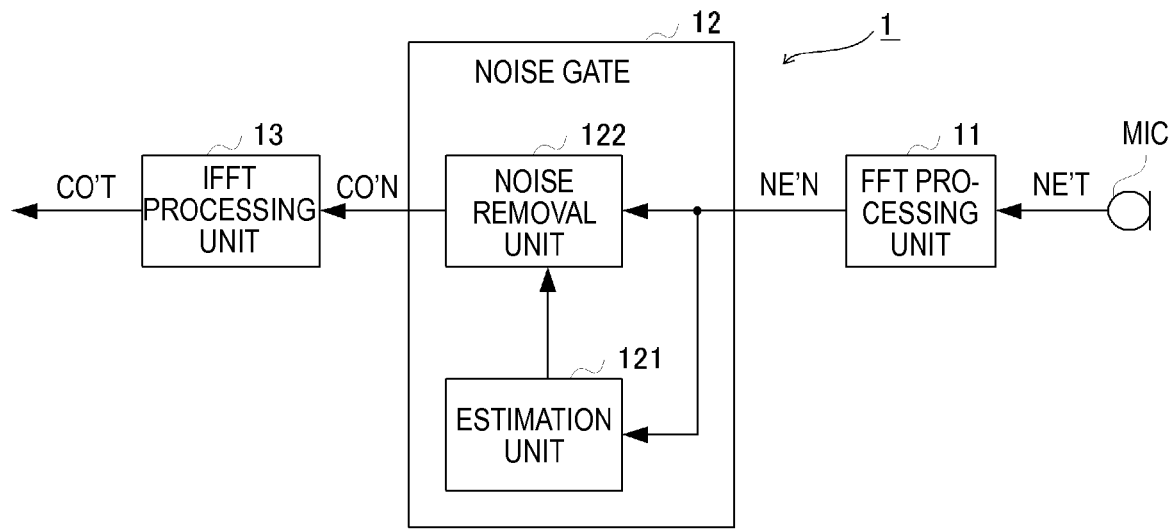
FIG. 1 is a block diagram showing a function and a structure of a sound collection device.
Figure 2:
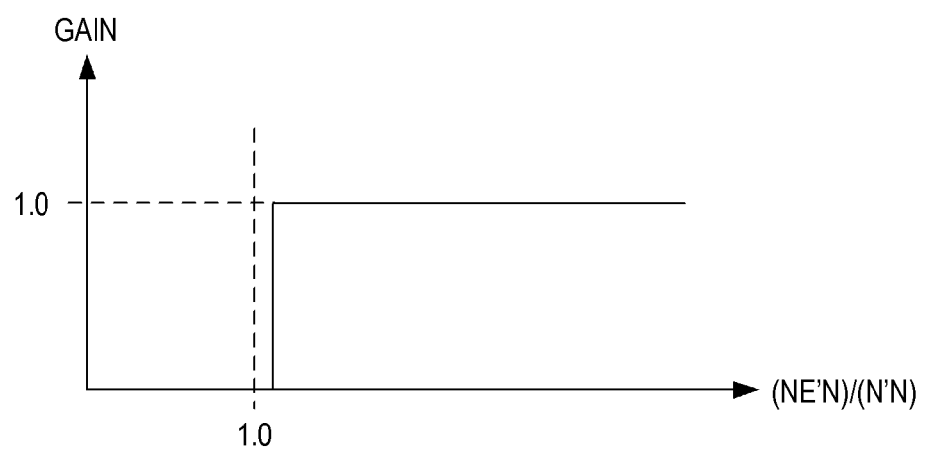
FIG. 2 is a graph showing an example of a gain table.

A sound collection device 1 according to the invention is described below with reference to FIGS. 1 and 2. FIG. 1 is a block diagram showing a function and a structure of the sound collection device 1. FIG. 2 is a graph showing an example of a gain table. The sound collection device 1 has a noise gate 12 (see FIG. 1). The sound collection device 1 transforms a collected audio signal NE'T into a frequency spectrum NE'N. The sound collection device 1 removes a stationary noise N'N included in the audio signal NE'N by using the noise gate 12. At that time, the stationary noise N'N is estimated based on the frequency spectrum NE'N by the noise gate 12. The sound collection device 1 outputs an audio signal CO'T which is generated in such a manner that a frequency spectrum CO'N after removing the stationary noise N'N is inversely transformed with respect to a time axis. Meanwhile, an end symbol of a signal in a time domain is indicated by 'T and an end symbol of a signal in a frequency domain is indicated by 'N in the descriptions below.

First, the function and the structure of the sound collection device 1 are described with reference to FIGS. 1 and 2. As shown in FIG. 1, the sound collection device 1 includes a microphone MIC, an FFT processing unit 11, the noise gate 12 and an IFFT processing unit 13.

The microphone MIC generates an audio signal by collecting ambient sounds. The microphone MIC outputs the generated audio signal NE'T to the FFT processing unit 11.

The FFT processing unit 11 is a fast Fourier transform circuit that transforms the audio signal NE'T as the signal in the time domain into the audio signal NE'N as the signal in the frequency domain and outputs the audio signal NE'N to an estimation unit 121 and a noise removal unit 122 in the noise gate 12.

The noise gate 12 has the estimation unit 121 and the noise removal unit 122.

The estimation unit 121 performs a process of estimating a stationary noise N'N included in the audio signal NE'N input from the FFT processing unit 11. The estimation unit 121 sequentially acquires frequency spectrums (hereinafter, referred to as the audio spectrum(s)) S (NE'N) at certain sampling times of the stationary noise N'N and stores them temporarily. The estimation unit 121 estimates frequency spectrums (hereinafter, referred to as the noise spectrum(s)) S (N'N) at certain sampling timings of the stationary noise N'N based on the plurality of times of audio spectrums S (NE'N) acquired and stored as in the above. The estimation unit 121 outputs the estimated noise spectrums S(N'N) to the noise removal unit 122.

For example, the noise spectrum at a certain sampling timing T is represented by S(N'N(T)), the audio spectrum at the same sampling timing T is represented by S(NE'N(T)), and the noise spectrum at the previous sampling timing T−1 is represented by S(N'N(T−1)). "α" and "β" are forgetting constants and they are, for example, set to be α=0.9 and β=0.1. The noise spectrum S(N'N(T)) is represented by the following formula 1.

$$S(N'N(T))=\alpha S(N'N(T-1))+\beta S(NE'N(T)) \quad \text{formula 1}$$

Thus, by estimating the noise spectrum S(N'N(T)) based on the audio spectrum, a stationary noise such as a background noise or the like can be estimated. The estimation unit 121 performs an estimating process of a noise spectrum only in a case where a level of an audio signal collected by the microphone MIC is in a low state (a silent state).

The noise removal unit 122 removes the stationary noise N'N from the audio signal NE'N input from the FFT processing unit 11 and outputs the audio signal CO'N after removing the noise to the IFFT processing unit 13. To be specific, the noise removal unit 122 computes a signal level ratio of the audio spectrum S(NE'N) to the noise spectrum S(N'N) input from the estimation unit 121. In a case where the computed signal level ratio is less than the threshold value, the noise removal unit 122 decreases the gain of the audio spectrum S(NE'N) in a frequency band having the signal level ratio less than the threshold value, and outputs the audio signal.

For example, the noise removal unit 122 has a gain table TBL shown in FIG. 2. The gain table TBL determines the gain of the audio spectrum S(NE'N) in accordance with the computed signal level ratio. The gain table TBL makes the gain of the audio spectrum S(NE'N) to be 1 in a case where the signal level ratio is equal to or greater than the threshold value and makes the gain of the audio spectrum S(NE'N) to be 0 in a case where the signal level ratio is less than the threshold value. In this case, the frequency spectrum S(CO'N) at a certain sampling timing of the audio signal CO'N after removing the noise can be represented by the following formula 2.

$$S(CO'N)=(TBL(S(NE'N)/S(N'N))\cdot S(NE'N) \quad \text{formula 2}$$

As a result, in a frequency band in which the signal level ratio is equal to or greater than the threshold value, the noise removal unit 122 outputs the audio spectrum S(NE'N) as it is without changing the signal level of the audio spectrum S(NE'N). Alternatively, in a frequency band in which the signal level ratio is less than the threshold value, the noise removal unit 122 outputs the audio spectrum S(NE'N) having a signal level which is zero since the audio spectrum S(NE'N) is assumed as the noise spectrum S(N'N).

In addition, by considering an estimation error of the stationary noise N'N, the noise removal unit 122 may set a threshold value of the signal level ratio to a value being slightly greater than the threshold value (1.0) of the signal level ratio. With this, the noise removal unit 122 can remove the stationary noise N'N even in a case where the signal level of the stationary noise N'N is estimated to be less than an actual level because of the estimation error of the stationary noise N'N.

The IFFT processing unit 13 is an inverse fast Fourier transform circuit that transforms the audio signal CO'N as a signal of a frequency domain into an audio signal CO'T as a signal of a time domain.

With the above, since the sound collection device 1 can leave the audio signal as it is without attenuating the audio signal in the frequency band having an utterance voice of a speaking person, the utterance voice of the speaking person can be output without being degraded.

Figure 3:
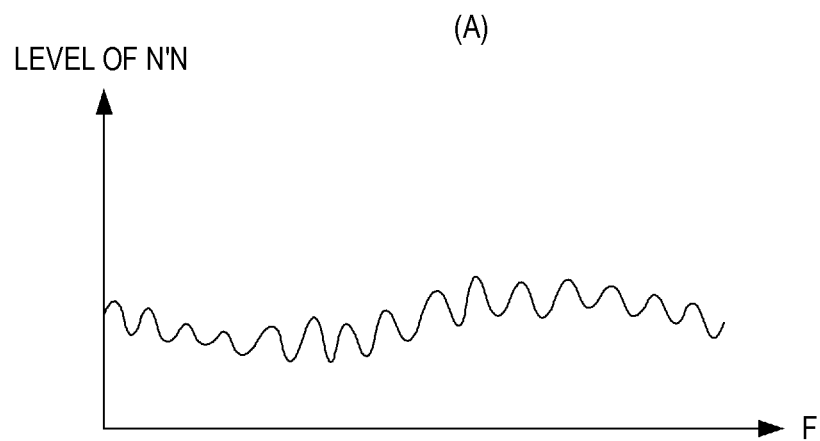
FIGS. 3(A), 3(B) and 3(C) are graphs respectively showing examples of a stationary noise, an audio signal and an audio signal after removing a noise.
Figure 3:
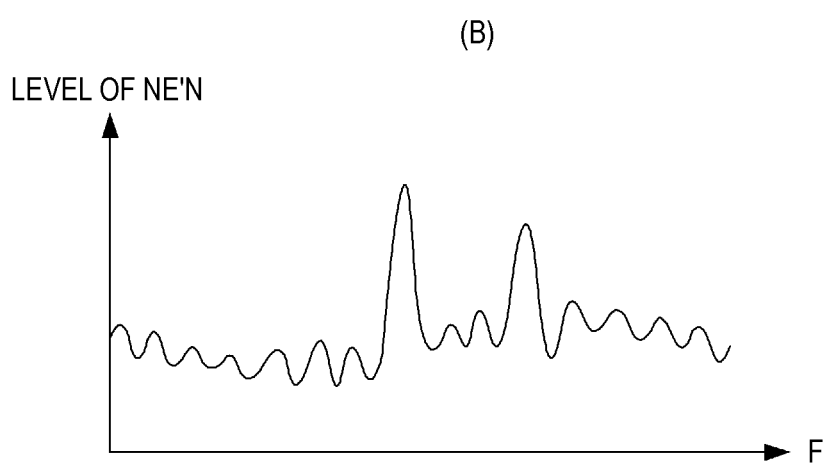
Figure 3:
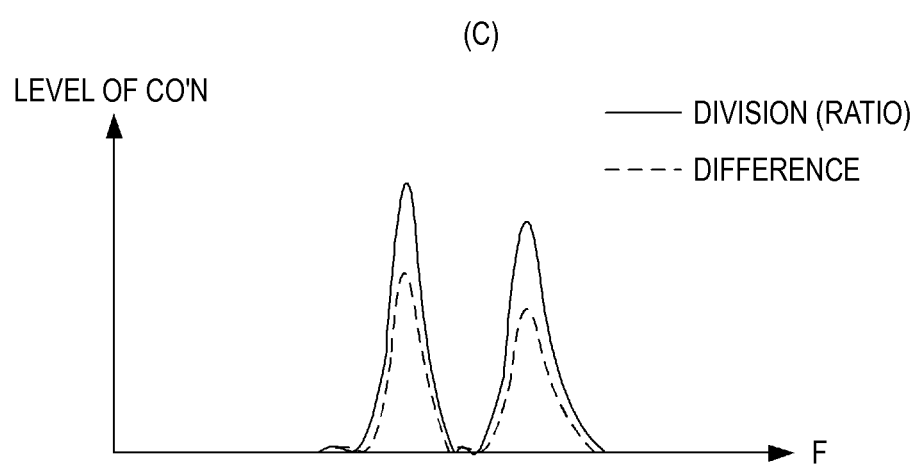

The audio signal CO'N after removing the noise as the output value of the noise gate 12 is described with reference to FIGS. 3(A) to 3(C). FIGS. 3(A) to 3(C) are graphs respectively showing examples of the stationary noise, the audio signal and the audio signal after removing the stationary noise. FIG. 3(A) indicates a signal level of the stationary noise, FIG. 3(B) indicates a signal level of the audio signal including the stationary noise, and FIG. 3(C) indicates a signal level of the audio signal after removing the stationary noise.

The sound collection device 1 estimates the stationary noise N'N as shown in FIG. 3(A) and generates the audio signal NE'N as shown in FIG. 3(B).

When the sound collection device 1 simply subtracts the noise N'N from the audio signal NE'N in order to remove the stationary noise N'N from the audio signal NE'N, the signal level of the audio signal NE'N is attenuated even in a frequency band having an utterance voice of a speaking person as shown by a dotted line in FIG. 3(C) so that the sound collection device 1 may output a sound having degraded quality. The sound collection device 1 may have a case where the stationary noise N'N remains in the audio signal NE'N because of the estimation error of the stationary noise N'N. In this case, the sound collection device 1 may generate a musical noise because the signal level is remarkably varied in a frequency band not having an utterance voice of a speaking person.

In the embodiment, since the sound collection device 1 leaves a frequency band having an utterance voice of a speaking person as shown by a solid line in FIG. 3(C) and decreases the signal level (the gain) of the audio signal in a frequency band not having an utterance voice of a speaking person (a frequency band only having a noise), the sound collection device 1 can output a sound without degrading the quality of the utterance voice of the speaking person. In addition, since the sound collection device 1 determines the output value CO'N in accordance with the signal level ratio of the audio signal NE'N to the stationary noise N'N, variation in the signal level is not liable to occur in the frequency band not having an utterance voice of a speaking person and occurrence of the musical noise can be prevented. Further, since the sound collection device 1 computes the signal level ratio of the audio signal NE'N to the stationary noise N'N, a frequency band only having a noise can be detected even when a level of an utterance voice of a speaking person is low.

Figure 4:
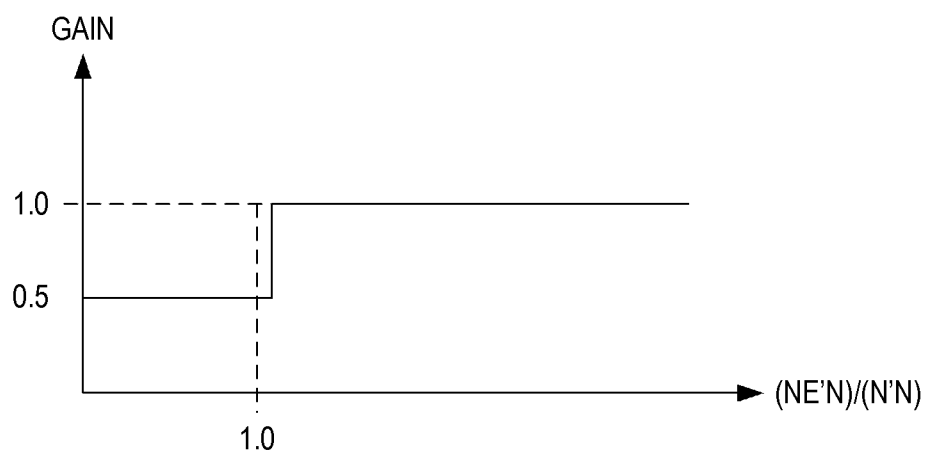
FIG. 4 is a graph showing another example of a gain table.

In the above embodiment, the sound collection device 1 maintains the signal level of the audio signal in the frequency band having an utterance voice of a speaking person and makes the signal level (the gain) of the audio signal in the frequency band not having an utterance voice of a speaking person to be 0, and then outputs the audio signal. However, the sound collection device 1 can maintain the signal level of the audio signal in the frequency band having an utterance voice of a speaking person and can decrease the signal level (the gain) of the audio signal in the frequency band not having an utterance voice of a speaking person to be a value greater than 0. FIG. 4 is a graph showing another example of a gain table. In this case, for example, as shown in FIG. 4, the sound collection device 1 determines the gain of the audio signal in the frequency band not having an utterance voice of a speaking person to be 0.5 and outputs the audio signal in the frequency band not having an utterance voice of a speaking person by multiplying 0.5 to the signal level of the audio signal. With this, since the stationary noise in the frequency band having an utterance voice of a speaking person is not remarkable, the sound collection device 1 can naturally output the voice of the speaking person.

While the invention is described in detail by referring to the specific embodiment, it is understood by those of ordinary skill in the art that various modifications and changes can be made without departing from the sprit and scope of the invention. This application is based on Japanese Patent Application (JP-2008-298332) filed on Nov. 21, 2008, the contents of which are incorporated herein by reference.

INDUSTRIAL APPLICABILITY

It is possible to provide a noise gate that outputs an audio signal in which only a stationary noise is removed without degrading an utterance voice of a speaking person.

DESCRIPTION OF REFERENCE NUMERALS AND SIGNS

1 sound collection device
11 FFT processing unit
12 noise gate
121 estimation unit
122 noise removal unit
13 IFFT processing unit
MIC microphone

The invention claimed is:

1. A noise gate comprising:
   an input unit to which a frequency spectrum of an audio signal is input;
   an estimation unit adapted to estimate a noise spectrum based on the frequency spectrum of the audio signal input to the input unit; and
   an output unit adapted to compute a signal level ratio of the frequency spectrum of the audio signal to the noise spectrum estimated by the estimation unit and to output the frequency spectrum of the audio signal in which the signal level in a frequency band having the signal level ratio less than a predetermined threshold value is decreased by a constant level and the signal level in the frequency band having the signal level ratio equal to or greater than the predetermined threshold is maintained.

2. The noise gate according to claim 1, wherein the threshold value is set to a value greater than 1.

3. A sound collection device comprising:
   a noise gate including:
      an input unit to which a frequency spectrum of an audio signal is input;
      an estimation unit adapted to estimate a noise spectrum based on the frequency spectrum of the audio signal input to the input unit;
      an output unit adapted to compute a signal level ratio of the frequency spectrum of the audio signal to the noise spectrum estimated by the estimation unit and to output the frequency spectrum of the audio signal in which the signal level in a frequency band having the signal level ratio less than a predetermined threshold value is decreased by a constant level and the signal level in the frequency band having the signal level ratio equal to or greater than the predetermined threshold is maintained; and
   a sound collection unit adapted to collect ambient sounds and to generate an audio signal;
   a transformation unit adapted to transform the audio signal generated by the sound collection unit into a frequency spectrum as a signal of a frequency domain and arranged such that the frequency spectrum transformed by the transformation unit is input into the input unit of the noise gate; and
   an inverse transformation unit adapted to inversely transform the frequency spectrum of the audio signal output by the output unit of the noise gate into an audio signal as a signal in a time domain.

4. The sound collection device according to claim 3, wherein the threshold value is set to a value greater than 1.

5. A noise removing method comprising the steps of:
   inputting a frequency spectrum of an audio signal;
   estimating a noise spectrum based on the frequency spectrum of the audio signal input in the inputting step;
   computing a signal level ratio of the frequency spectrum of the audio signal to the noise spectrum estimated in the estimating step; and
   outputting the frequency spectrum of the audio signal in which the signal level in a frequency band having the signal level ratio less than a predetermined threshold value is decreased by a constant level and the signal level in the frequency band having the signal level ratio equal to or greater than the predetermined threshold is maintained, the signal level ratio being computed in the computing step.

6. The noise removing method according to claim 5, wherein the threshold value is set to a value greater than 1.

* * * * *